(12) United States Patent
Ushikura

(10) Patent No.: US 8,754,478 B2
(45) Date of Patent: Jun. 17, 2014

(54) ORGANIC THIN-FILM TRANSISTOR, METHOD OF MANUFACTURING ORGANIC THIN-FILM TRANSISTOR, AND DISPLAY

(75) Inventor: Shinichi Ushikura, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/618,839

(22) Filed: Sep. 14, 2012

(65) Prior Publication Data

US 2013/0092904 A1    Apr. 18, 2013

(30) Foreign Application Priority Data

Oct. 12, 2011   (JP) ................. 2011-224949

(51) Int. Cl.
*H01L 27/12* (2006.01)
*H01L 21/20* (2006.01)

(52) U.S. Cl.
USPC ............ 257/347; 257/E27.112; 257/E21.409; 438/479

(58) Field of Classification Search
None
See application file for complete search history.

(56) References Cited

U.S. PATENT DOCUMENTS

2006/0131568 A1*  6/2006  Meng et al. ............. 257/40
2011/0084252 A1*  4/2011  Wu et al. ................. 257/40

OTHER PUBLICATIONS

Kuo et al., "Direct lithographic top contacts for pentacene organic thin-film transistors", Applied Physics Letters 94, 2009, 053304.
Lee et al., "Integration of reduced graphene oxide into organic field-effect transistors as conducting electrodes and as a metal modification layer", Applied Physics Letters 95, 2009, 023304.

* cited by examiner

*Primary Examiner* — Michael Lebentritt
*Assistant Examiner* — Kevin Quinto
(74) *Attorney, Agent, or Firm* — K&L Gates LLP

(57) ABSTRACT

An organic thin-film transistor includes: a semiconductor layer made of an organic material; a gate electrode; a source electrode and a drain electrode each at least partially provided above the semiconductor layer; and a conductive layer containing an oxide having conductivity that changes due to reduction, the conductive layer being provided in each of a first region and a second region facing the source electrode and the drain electrode provided above the semiconductor layer, respectively.

14 Claims, 14 Drawing Sheets

TOP-GATE/TOP-CONTACT STRUCTURE

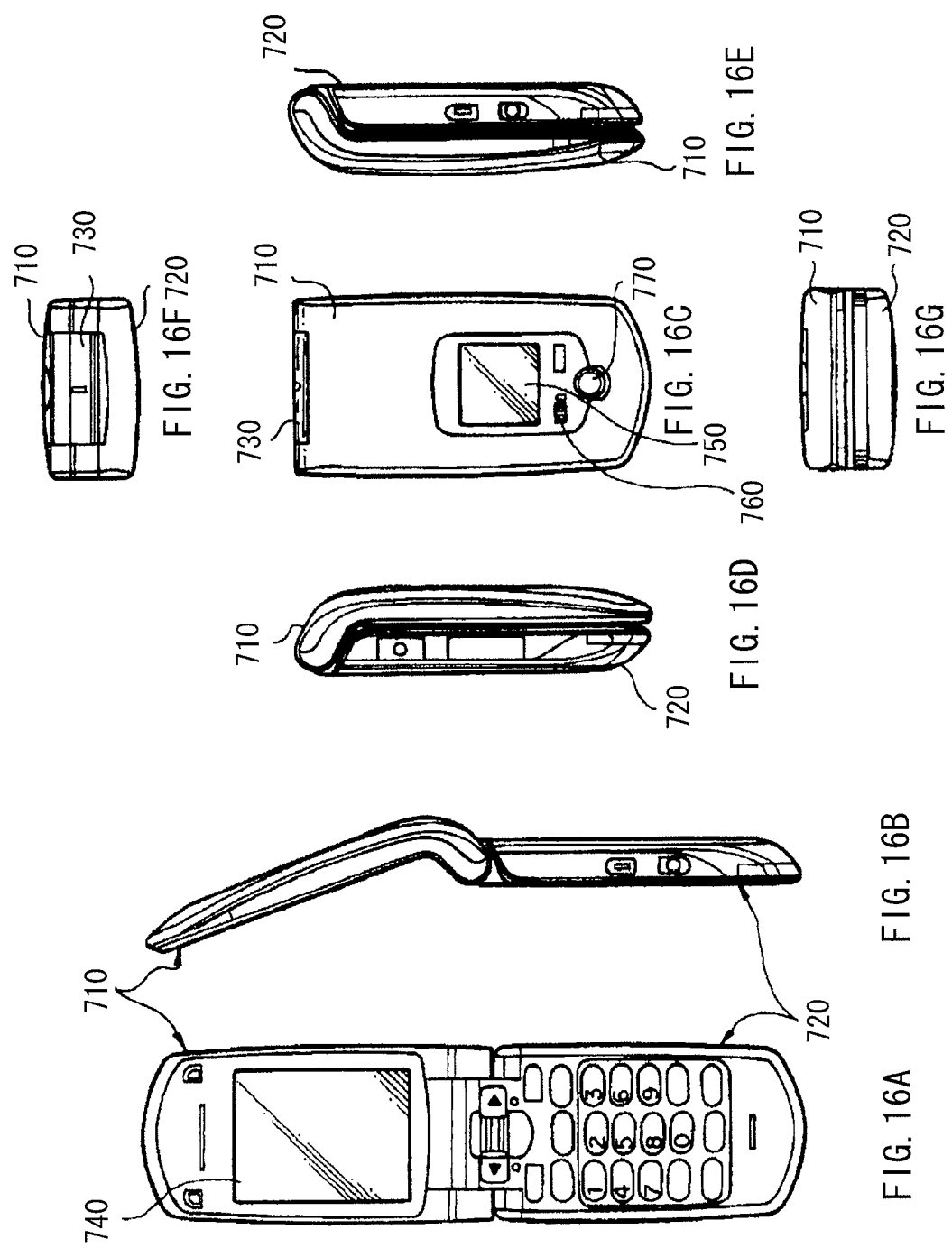

ORGANIC THIN-FILM TRANSISTOR,
METHOD OF MANUFACTURING ORGANIC
THIN-FILM TRANSISTOR, AND DISPLAY

CROSS REFERENCES TO RELATED
APPLICATIONS

The present application claims priority to Japanese Patent Application No. 2011-224949 filed on Oct. 12, 2011, the disclosure of which is incorporated herein by reference.

BACKGROUND

The disclosure relates to an organic thin-film transistor (TFT) using, for example, an organic semiconductor.

In general, there are various kinds of TFTs including TFTs each using an inorganic material for a semiconductor layer serving as an active layer (i.e. inorganic TFTs), and organic TFTs each using an organic material for a semiconductor layer. Development of the organic TFTs as drive devices for flexible displays has been pursued. The organic TFTs include those each having a so-called bottom-contact structure (see, for example, "Direct lithographic top contacts for pentacene organic thin-film transistors", C.-C. Kuo, T. N Jackson, [on-line], APPLIED PHYSICS LETTERS 94, 053304 (2009)) and those each having a top-contact structure (see, for example, "Integration of reduced graphene oxide into organic field-effect transistors as conducting electrodes and as a metal modification layer", Chen-Guan Lee, and three others, [on-line], APPLIED PHYSICS LETTERS 95, 023304 (2009)).

SUMMARY

As for the organic TFTs described above, however, it is necessary to etch a conductive film on the semiconductor layer when a source electrode and a drain electrode are formed, in a case of adopting the top-contact structure in particular. Thus, the semiconductor layer is readily damaged. Therefore, there is such a disadvantage that transistor performance is adversely affected. In addition, there is also another disadvantage that it is difficult to ensure satisfactory contact (electrical connection) between the semiconductor layer made of an organic material and the source electrode as well as the drain electrodes (i.e. electrode materials achieving satisfactory contact are limited, and the selectivity thereof is poor).

It is desirable to provide an organic thin-film transistor, a method of manufacturing the organic thin-film transistor, and a display, which are capable of ensuring satisfactory contact between a semiconductor layer and a source as well as a drain. It is also desirable to provide an organic thin-film transistor, a method of manufacturing the organic thin-film transistor, and a display, which are capable of reducing damage to a semiconductor layer in a manufacturing process, in a case of adopting a top-contact structure in particular.

According to an embodiment of the disclosure, there is provided a first organic thin-film transistor including: a semiconductor layer made of an organic material; a gate electrode; a source electrode and a drain electrode each at least partially provided above the semiconductor layer; and a conductive layer containing an oxide having conductivity that changes due to reduction, the conductive layer being provided in each of a first region and a second region facing the source electrode and the drain electrode provided above the semiconductor layer, respectively.

In the first organic thin-film transistor according to the above-described embodiment of the disclosure, the conductive layer is provided in each of the first region and the second region facing the source electrode and the drain electrode above the semiconductor layer. This conductive layer includes the oxide having the conductivity that changes due to the reduction. This allows the conductive layer to function as a contact layer between the semiconductor layer and the source electrode as well as the drain electrode. In addition, in a case of adopting a top-contact structure in particular, an etching stopper layer is allowed to be formed on the semiconductor layer in a manufacturing process.

According to an embodiment of the disclosure, there is provided a second organic thin-film transistor including: a semiconductor layer made of an organic material; a gate electrode, a source electrode, and a drain electrode; and an oxide layer provided between the source electrode as well as the drain electrode and the semiconductor layer, the oxide layer exhibiting conductivity in a first region and a second region facing the source electrode and the drain electrode, respectively, and the oxide layer exhibiting insulation in a third region between the first region and the second region.

In the second organic thin-film transistor according to the above-described embodiment of the disclosure, there is provided the oxide layer that exhibits the conductivity in the first region and the second region facing the source electrode and the drain electrode, respectively, and exhibits the insulation in the third region between the first region and the second region. This allows a part of the oxide layer, corresponding to each of the first region and the second region, to function as a contact layer between the semiconductor layer and the source electrode as well as the drain electrode. In addition, in a case of adopting a top-contact structure in particular, the oxide layer is allowed to function as an etching stopper layer on the semiconductor layer in a manufacturing process.

According to an embodiment of the disclosure, there is provided a method of manufacturing an organic thin-film transistor, the method including: forming a semiconductor layer made of an organic material; forming a gate electrode; forming a source electrode and a drain electrode; and forming an oxide layer, the oxide layer exhibiting conductivity in a first region and a second region where the source electrode and the drain electrode are to be formed, respectively, the oxide layer exhibiting insulation in a third region between the first region and the second region.

The method of manufacturing the organic thin-film transistor, according to the above-described embodiment of the disclosure, includes forming the oxide layer. The oxide layer exhibits the conductivity in the first region and the second region where the source electrode and the drain electrode are to be formed, respectively, and exhibits the insulation in the third region between the first region and the second region. A part of the oxide layer, corresponding to each of the first region and the second region, is allowed to function as a contact layer between the semiconductor layer and the source electrode as well as the drain electrode. In addition, in a case of forming a top-contact structure in particular, the oxide layer is allowed to function as an etching stopper layer on the semiconductor layer.

According to an embodiment of the disclosure, there is provided a first display including a display section and an organic thin-film transistor, the display section including a plurality of pixels, the organic thin-film transistor serving as a drive device for each of the pixels, the organic thin-film transistor including: a semiconductor layer made of an organic material; a gate electrode; a source electrode and a drain electrode provided above the semiconductor layer; and a conductive layer containing an oxide having conductivity that changes due to reduction, the conductive layer being provided in each of a first region and a second region facing the source electrode and the drain electrode, respectively, and the source electrode and the drain electrode each being at least partially provided above the semiconductor layer.

According to an embodiment of the disclosure, there is provided a second display including a display section and an organic thin-film transistor, the display section including a plurality of pixels, the organic thin-film transistor serving as a drive device for each of the pixels, the organic thin-film transistor including: a semiconductor layer made of an organic material; a gate electrode, a source electrode, and a drain electrode; and an oxide layer provided between the source electrode as well as the drain electrode and the semiconductor layer, the oxide layer exhibiting conductivity in a first region and a second region facing the source electrode and the drain electrode, respectively, and the oxide layer exhibiting insulation in a third region between the first region and the second region.

According to the first organic thin-film transistor in the above-described embodiment of the disclosure, the conductive layer is provided in each of the first region and the second region facing the source electrode and the drain electrode above the semiconductor layer. This conductive layer includes the oxide having the conductivity that changes due to the reduction. This allows the conductive layer to function as the contact layer between the semiconductor layer and the source electrode as well as the drain electrode. In addition, in the case of adopting the top-contact structure, the etching stopper layer is allowed to be formed on the semiconductor layer in the manufacturing process. Therefore, satisfactory contact is allowed to be ensured between a source as well as a drain and the semiconductor layer. In addition, in the case of adopting the top-contact structure, a reduction in damage to the semiconductor layer in the manufacturing process is allowed.

According to the second organic thin-film transistor in the above-described embodiment of the disclosure, there is provided the oxide layer that exhibits the conductivity in the first region and the second region facing the source electrode and the drain electrode, respectively, and exhibits the insulation in the third region between the first region and the second region. This allows the part of the oxide layer to function as the contact layer between the semiconductor layer and the source electrode as well as the drain electrode. In addition, in the case of adopting the top-contact structure, the oxide layer is allowed to function as the etching stopper layer on the semiconductor layer in the manufacturing process. Therefore, satisfactory contact is allowed to be ensured between a source as well as a drain and the semiconductor layer. In addition, in the case of adopting the top-contact structure, a reduction in damage to the semiconductor layer in the manufacturing process is allowed.

According to the method of manufacturing the organic thin-film transistor in the above-described embodiment of the disclosure, forming the oxide layer is included. The oxide layer exhibits the conductivity in the first region and the second region where the source electrode and the drain electrode are to be formed, respectively, and exhibits the insulation in the third region between the first region and the second region. This allows the part of the oxide layer to function as the contact layer. In addition, in the case of forming the top-contact structure, the oxide layer is allowed to function as the etching stopper layer on the semiconductor layer. Therefore, satisfactory contact is allowed to be ensured between a source as well as a drain and the semiconductor layer. In addition, in the case of forming the top-contact structure in particular, a reduction in damage to the semiconductor layer in the manufacturing process is allowed.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIG. 13A illustrates the appearance when viewed from front, and FIG. 13B illustrates the appearance when viewed from back.

FIGS. 16A to 16G are views of an application example 5, namely, a front view in an open state, a side view in the open state, a front view in a closed state, a left-side view, a right-side view, a top view, and a bottom view, respectively.

DETAILED DESCRIPTION

Embodiments of the present application will be described below in detail with reference to the drawings.

An embodiment of the disclosure will be described below in detail with reference to the drawings. It is to be noted that the description will be provided in the following order.

1. Embodiment (an example of an organic TFT (bottom-gate/top-contact) with a graphite oxide layer that exhibits conductivity in a part on a semiconductor layer and insulation in other regions)
2. Modification 1 (an example in which an insulating layer is removed)
3. Modification 2 (an example of using another organic TFT (top-gate/top-contact))
4. Modification 3 (an example of using still another organic TFT (bottom-gate/bottom-contact))
5. Modification 4 (an example of using still another organic TFT (top-gate/bottom-contact))
6. Application examples (examples including displays each having any of the organic TFTs, and electronic units with the displays)

Embodiment

Configuration of Organic TFT 1

Figure 1:
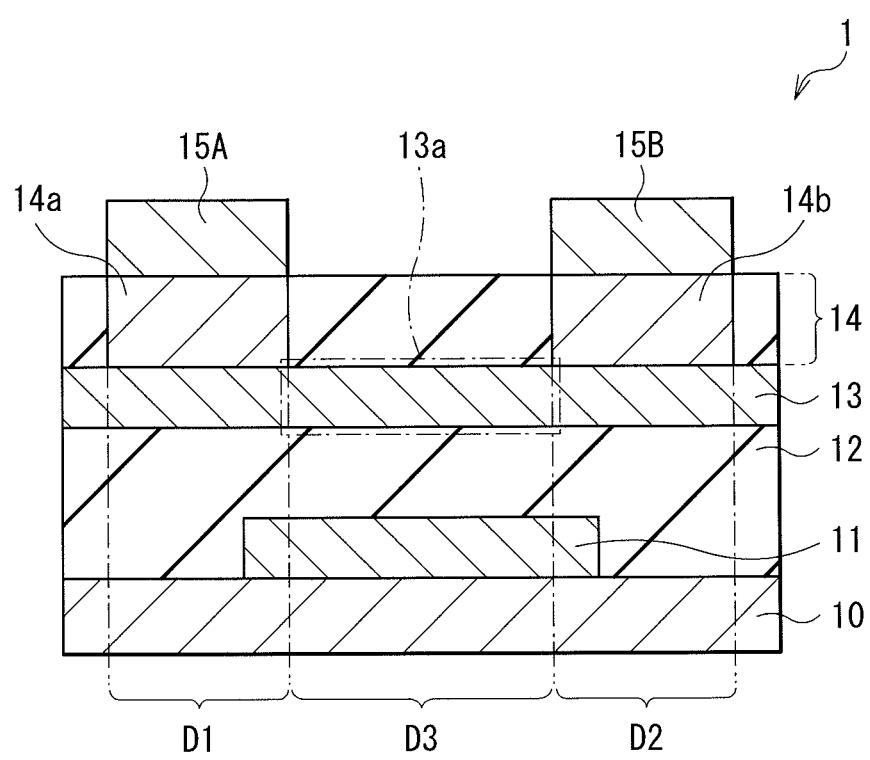
FIG. 1 is a cross-sectional diagram illustrating a schematic configuration of an organic TFT (bottom-gate/top-contact) according to an embodiment of the disclosure.

FIG. 1 illustrates a schematic configuration of an organic TFT (an organic TFT 1) according to an embodiment of the disclosure. The organic TFT 1 has, for example, a so-called bottom-gate/top-contact structure. The organic TFT 1 includes a gate electrode 11 in a selective region on a substrate 10. Provided on this gate electrode 11 is an organic semiconductor layer 13, with a gate insulating film 12 interposed therebetween. The organic semiconductor layer 13 is formed to have a pattern in a selective region facing the gate electrode 11, on the gate insulating film 12. A source electrode 15A and a drain electrode 15B are disposed to be electrically connected to this organic semiconductor layer 13.

The substrate 10 is a plastic substrate made of, for example, polyimide (PI), polyethylene terephthalate (PET), polyether sulfone (PES), polyethylene naphthalate (PEN), and polycarbonate (PC). The substrate 10 of any type is acceptable as long as at least a surface thereof has insulation. The substrate 10 may be a metal substrate made of a material such as stainless steel (SUS), aluminum (Al), and copper (Cu), and having a surface to which an insulation treatment is applied. Further, in addition to those capable of exhibiting flexibility such as the plastic substrate and the metal substrate described above, those having rigidity such as a glass substrate may be used as the substrate 10. The gate electrode 11 controls a carrier density in the organic semiconductor layer 13 based on a gate voltage (Vg) applied to the organic TFT 1, and also has a function of serving as a wire that supplies an electric potential. The gate electrode 11 is configured using a single layer film made of, for example, one of gold (Au), aluminum (Al), silver (Ag), copper, platinum (Pt), nickel (Ni), and the like, or a laminated film including two or more of these materials. When gold is used as the material of the gate electrode 11, adhesion between the substrate 10 and the gate electrode 11 is allowed to be increased by forming a primary layer made of chromium (Cr).

The gate insulating film 12 is a single layer film made of, for example, one of polyvinyl phenol (PVP), polymethyl methacrylate (PMMA), polyvinyl alcohol (PVA), and the like, or a laminated film made of two or more of these materials. The gate insulating film 12 is allowed to be formed using a printing method such as spin coating, ink jet printing, screen printing, offset printing, and gravure printing. However, other than these organic films, an inorganic insulating film made of silicon oxide ($SiO_2$), silicon nitride ($SiNx$), aluminum oxide ($Al_2O_3$), tantalum oxide ($Ta_2O_5$), or the like, may be used as the gate insulating film 12.

The organic semiconductor layer 13 forms a channel through the application of the gate voltage. For example, a derivative of any one of pentacene, anthracene, phthalocyanine, porphyrin, and a thiophene-based polymer, or a mixture of two or more of these materials may be used for the organic semiconductor layer 13. In addition, there may be used an n-type organic semiconductor material such as fullerene, perfluoropentacene, and poly(benzobisimidazobenzophenanthroline). The organic semiconductor layer 13 is formed by patterning a film, after the film made of any of the materials described above is formed through coating such as spin coating and slit coating.

The source electrode 15A and the drain electrode 15B are disposed to be electrically connected to the organic semiconductor layer 13, and to be separated electrically from each other. Each of the source electrode 15A and the drain electrode 15B is a single layer film made of gold, copper, silver, and aluminum, or a laminated film made of one or more of these materials. Alternatively, conductive ink containing electrically-conductive fine particles may be used as the material of each of the source electrode 15A and the drain electrode 15B.

Graphene Oxide Layer 14

In the present embodiment, a graphene oxide layer 14 (which will be hereinafter referred to as "GO layer 14") is provided between the organic semiconductor layer 13 and the source electrode 15A as well as the drain electrode 15B. The GO layer 14 except for selective parts (regions D1 and D2 which will be described later) thereof is configured using a graphene oxide simple substance, or a mixture of a graphene oxide and other material, e.g. organic molecules, an organic polymer, or inorganic particles. The graphene oxide is a substance produced by oxidizing graphene, and has solubility and electrical insulation. The GO layer 14 has a thickness of, for example, about 1 atomic layer to about 50 nm. In addition, the insulation necessary for the graphene oxide in the GO layer 14 is, for example, at a level in which an off-state current is suppressed to about $10^{-12}$ A or less. The GO layer 14 has this insulation in a part corresponding to a region D3 which will be described later. The graphene oxide has such a property that characteristics change due to reduction (due to a reduction treatment). Specifically, the reduced graphene oxide exhibits conductivity. In the present embodiment, a part of the GO layer 14 is selectively reduced so that this reduced part exhibits the conductivity, by utilizing this property.

Specifically, the GO layer 14 exhibits the conductivity in the selective regions D1 and D2, and exhibits the insulation in the region D3 between the region D1 and the region D2. In other words, the parts of the GO layer 14 respectively corresponding to the region D1 and the region D2 are reduced graphene oxide layers 14a and 14b (which will be hereinafter referred to as "r-GO layers 14a and 14b"). The GO layer 14 having the r-GO layers 14a and 14b is formed by selectively reducing the graphene oxide as described above, in only the regions D1 and D2.

The r-GO layers 14a and 14b are each configured of a simple substance of the reduced graphene oxide, or configured to contain organic molecules, an organic polymer, or inorganic particles in addition to the reduced graphene oxide.

The reduced graphene oxide is generated by reducing the graphene oxide as described above, and exhibits the conductivity. The reduced graphene oxide is also insoluble in water. To obtain the reduced graphene oxide, the treatment may be performed until the graphene oxide is completely reduced (i.e. until returning to graphene). However, the graphene oxide is reduced at a rate of reduction that enables achievement of desired conductivity. Specifically, the reduction is acceptable as long as ohmic contact with the source electrode 15A and the drain electrode 15B occurs, depending on factors such as a work function of each material used in the organic semiconductor layer 13, the source electrode 15A, and the drain electrode 15B, and the thickness of the GO layer 14. As the reduction treatment, as will be described later in detail, a photoreduction treatment, a heat reduction treatment, a chemical-using reduction treatment, or the like, may be used, or any of these reduction treatments may be used together. It is to be noted that the r-GO layers 14a and 14b correspond to a specific, but not limitative example of "conductive layer" of the disclosure.

It is to be noted that the region D1 and the region D2 are regions facing the source electrode 15A and the drain electrode 15B, respectively. The region D3 is a region facing, for example, the gate electrode 11 and a channel 13a formed in the organic semiconductor layer 13. Here, a region except the regions D1, D2, and D3 is an insulating layer made of the graphene oxide, similar to the region D3.

Method of Manufacturing Organic TFT 1

FIG. 2A to FIG. 5B are diagrams used to describe a method of manufacturing the organic TFT 1. The organic TFT 1 may be manufactured as follows, for example.

Figure 2A:
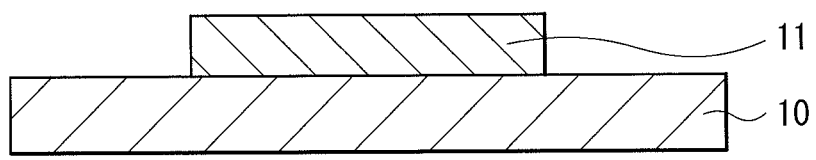
FIGS. 2A to 2C are cross-sectional diagrams illustrating a method of manufacturing the organic TFT illustrated in FIG. 1, in a process order.

First, as illustrated in FIG. 2A, the gate electrode 11 is formed in a selective region on the substrate 10. Specifically, at first, the material described above used to form a conductive film is deposited on the entire surface of the substrate 10 by vacuum deposition, sputtering, or the like. On the conductive film thus formed, a photoresist is formed to have a pattern by using, for example, a photolithographic method. Subsequently, the conductive film is patterned into a predetermined shape by being etched using this photoresist as a mask. The gate electrode 11 is thus formed. As a technique of forming the gate electrode 11, printing methods such as screen printing, gravure printing, and ink jet printing, other than the one described above, may be used.

Figure 2B:
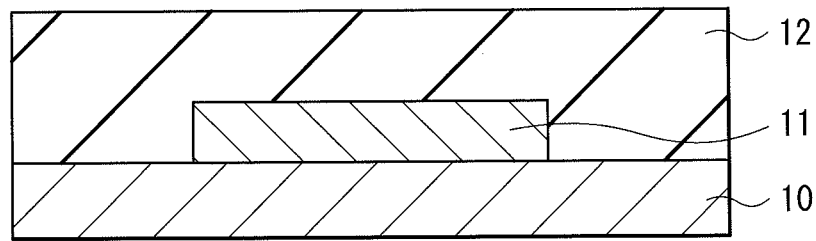

Next, as illustrated in FIG. 2B, the gate insulating film 12 is formed over the entire surface on the substrate 10. Specifically, over the entire surface of the substrate 10, an organic insulating film made of the material described above is formed by coating including printing methods such as spin coating, screen printing, gravure printing, and ink jet printing. On the other hand, when an inorganic insulating material is used for the gate insulating film 12, a film is formed by, for example, deposition method, sputtering, or chemical vapor deposition (CVD).

Figure 2C:
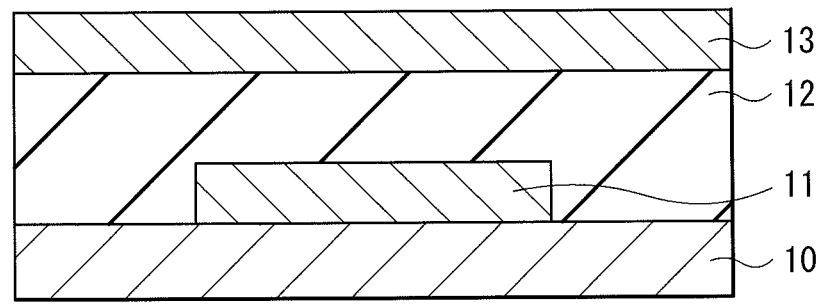

Next, as illustrated in FIG. 2C, the organic semiconductor layer 13 is formed on the gate insulating film 12. Specifically, at first, an organic semiconductor film made of the material described above is formed to have a pattern shaped like an island, over the entire surface on the substrate 10, through the use of, for example, deposition method using a mask, a printing method, or the like. The organic semiconductor layer 13 is formed to overlap the gate electrode 11. It is to be noted that when it is not necessary to separate devices, the gate insulating film 12 and the organic semiconductor layer 13 may be sequentially formed by coating, without depending on the techniques described above.

Formation of Graphene Oxide Layer 14

Figure 3A:
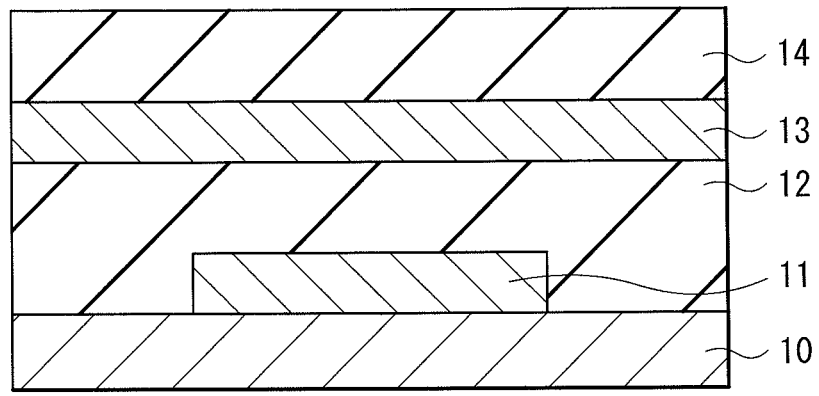
FIGS. 3A and 3B are cross-sectional diagrams illustrating a process following the process of FIG. 2C.

Next, the GO layer 14 is formed. Specifically, at first, as illustrated in FIG. 3A, a solution in which the graphene oxide described above is dissolved in a solvent is applied to form a film that covers at least the organic semiconductor layer 13. This film is formed using, for example, spin coating, screen printing, gravure printing, an ink-jet method, or a Langmuir-Blodgett technique.

Figure 3B:
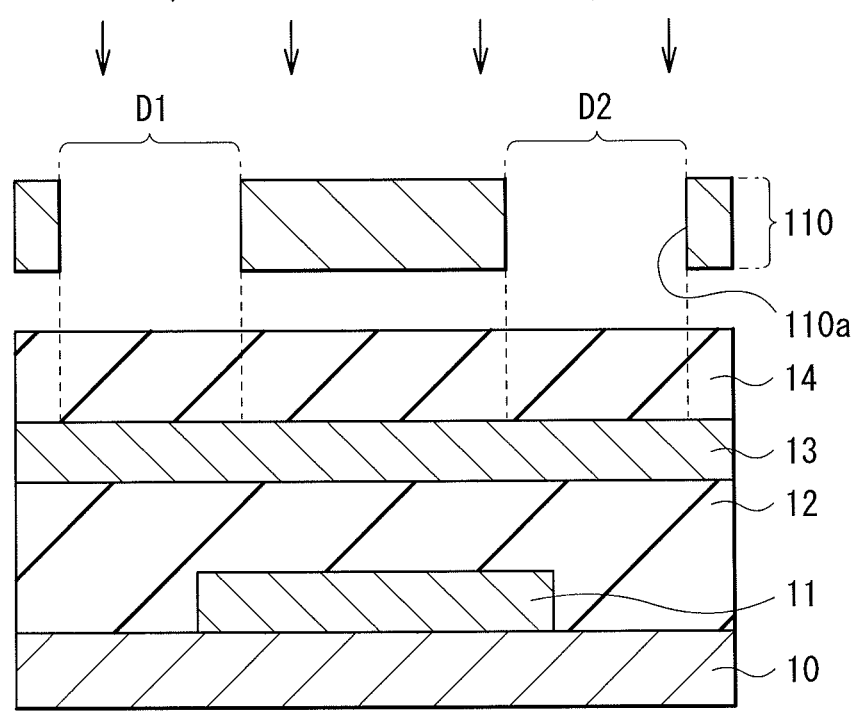

Subsequently, a part of the formed film containing the graphene oxide is subjected to the reduction treatment. Specifically, in the present embodiment, a part of the graphene oxide is selectively exposed using a photomask 110 that has an opening 110a in each of the regions D1 and D2 (i.e. the photoreduction treatment is performed), as illustrated in FIG. 3B. Reduction conditions used herein may be set as appropriate to the extent that predetermined conductivity is achieved, as described above. For example, in a case of using a general xenon lamp having a wavelength distribution of about 300 nm to about 1,100 nm, desired conductivity (ohmic contact with the source electrode 15A and the drain electrode 15B) has been achieved with an amount of irradiation of about 2 (J/cm$^2$). In this case, a peri-xanthenoxanthene derivative is used for the organic semiconductor layer 13, and aluminum (Al) is used for the source electrode 15A and the drain electrode 15B.

Figure 4:
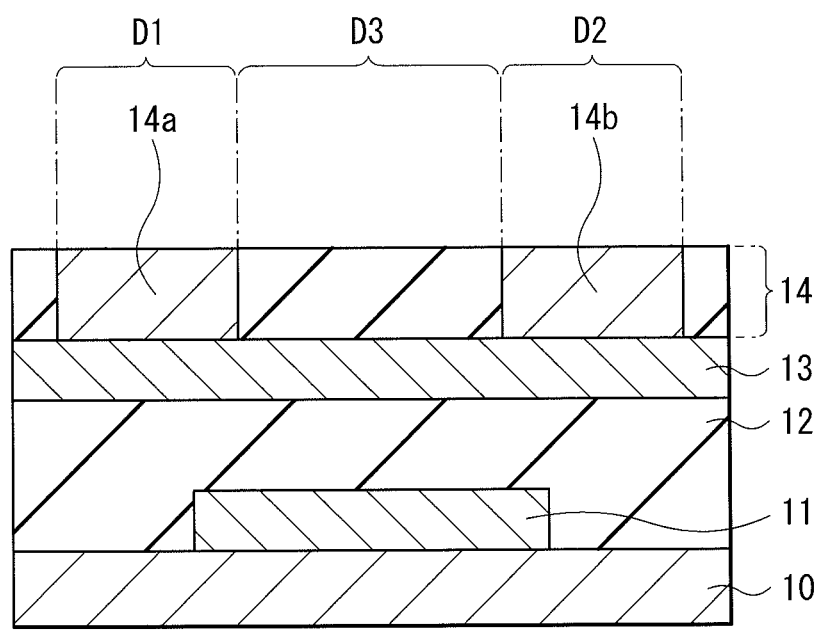
FIG. 4 is a cross-sectional diagram illustrating a process following the process of FIG. 3B.

As a result, in only the regions D1 and D2, the graphene oxide is reduced and the r-GO layers 14a and 14b are formed, as illustrated in FIG. 4. In other words, there is formed the GO layer 14 that exhibits the conductivity in the regions D1 and D2, while exhibiting the insulation in the region D3 (and the region except the regions D1 to D3).

Figure 5A:
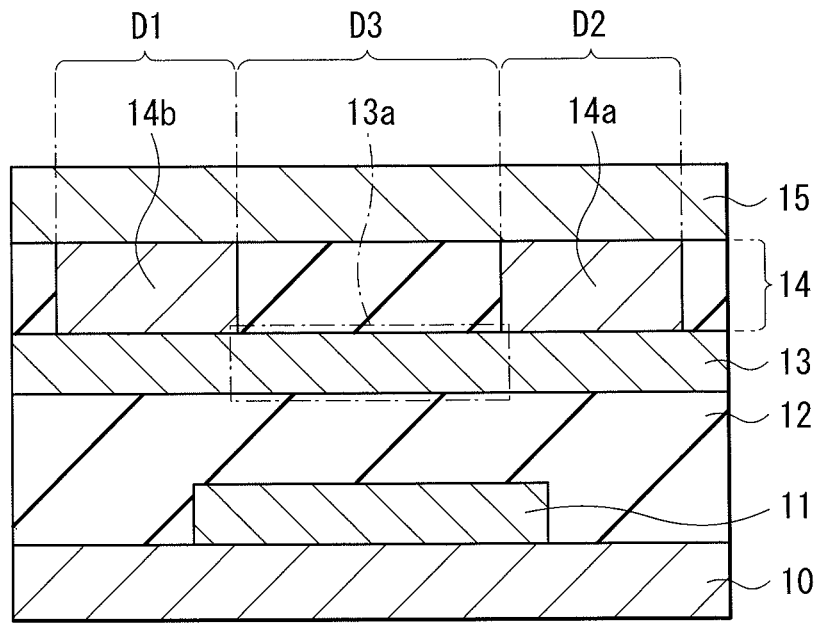
FIGS. 5A and 5B are cross-sectional diagrams illustrating a process following the process of FIG. 4.
Figure 5B:
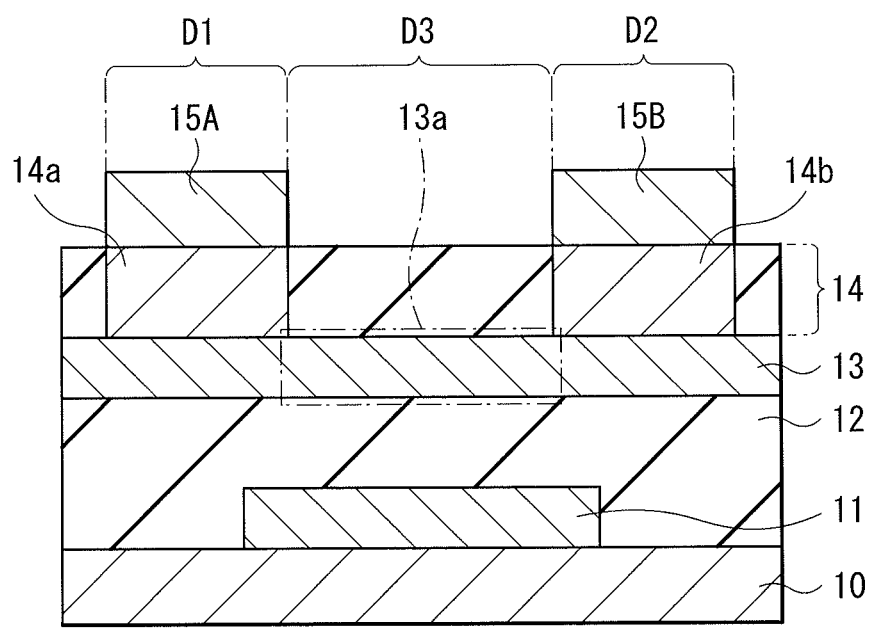

Next, the source electrode 15A and the drain electrode 15B are formed. Specifically, at first, a conductive film 15 made of the electrode material described above is formed on the GO layer 14, as illustrated in FIG. 5A. Subsequently, as illustrated in FIG. 5B, pattern formation of each of the source electrode 15A in the region D1 and the drain electrode 15B in the region D2 is performed by etching using a lithographic method. As the etching used herein, either dry etching or wet etching is applicable. This completes the organic TFT 1 illustrated in FIG. 1.

In the present embodiment, the GO layer 14 having the r-GO layers 14a and 14b in the selective regions D1 and D2 is provided as described above. Thus, the r-GO layer 14a is allowed to be interposed between the organic semiconductor layer 13 and the source electrode 15A, and the r-GO layer 14b is allowed to be interposed between the organic semiconductor layer 13 and the drain electrode 15B. Since the r-GO layers 14a and 14b exhibit the conductivity as described above, the r-GO layers 14a and 14b are enabled to achieve the ohmic contact with the source electrode 15A and the drain electrode 15B, respectively. In other words, the r-GO layers 14a and 14b are each allowed to serve as an electrical contact layer, between the organic semiconductor layer 13 and the source electrode 15A as well as the drain electrode 15B. Meanwhile, the GO layer 14 exhibits the insulation in the region D3 between the regions D1 and D2 and thus, the source electrode 15A and the drain electrode 15B are electrically separated from each other.

Accordingly, in the case of adopting the top-contact structure in particular, a part of the GO layer 14, functioning as an etching stopper layer, is enabled to function also as a contact layer, by utilizing the fact that the conductivity of the graphene oxide changes due to the reduction.

Function and Effects

In the organic TFT 1 of the present embodiment, when a predetermined electric potential is supplied to the gate electrode 11, an electric field is generated in the channel 13a of the organic semiconductor layer 13, and a current flows between the source electrode 15A and the drain electrode 15B. Thus, the organic TFT 1 functions as a so-called field-effect transistor.

Here, as the field effect TFT described above, there is a TFT using an inorganic semiconductor (an inorganic TFT), other than the TFT using the organic semiconductor as in the present embodiment. In general, for the inorganic TFT, etching techniques such as dry etching have reached maturity and thus, the inorganic TFT is reliable in terms of productivity, processing accuracy, and the like. In addition, since the inorganic semiconductor is superior in etching tolerance, the properties of the TFT in itself are hardly affected, even when over etching occurs at the time of forming a source and a drain.

On the other hand, as for the TFT using the organic semiconductor, generally, processing accuracy is lower than that of the inorganic TFT, and a channel part, in particular, of the organic semiconductor is easily damaged at the time of forming a source and a drain. For this reason, electron field-effect mobility drops, and a parasitic transistor is easily generated. It is to be noted that, in order to avoid this situation, a source electrode and a drain electrode are patterned by a lift-off technology using a water-soluble polymer (polyvinyl alcohol) that does not erode an organic semiconductor, in "Direct lithographic top contacts for pentacene organic thin-film transistors", C.-C. Kuo, T. N Jackson, [online], APPLIED PHYSICS LETTERS 94, 053304 (2009). In this technique, however, a residue of the polyvinyl alcohol attaches onto an organic semiconductor layer. This results in an increase in contact resistance between the source electrode as well as the drain electrode and the organic semiconductor layer, thereby reducing the electron field-effect mobility.

Therefore, in the organic TFT 1 of the present embodiment, the GO layer 14 is formed on the organic semiconductor layer 13, and of this GO layer 14, the r-GO layers 14a and 14b which exhibit the conductivity are formed in the regions D1 and D2 facing the source electrode 15A and the drain electrode 15B, respectively. Thus, the r-GO layers 14a and 14b each function as the contact layer, between the organic semiconductor layer 13 and the source electrode 15A as well as the drain electrode 15B. In addition, in the case of adopting the top-contact structure in particular, the GO layer 14 functions as the etching stopper layer on the organic semiconductor layer 13 in a manufacturing process.

Moreover, in the present embodiment, the configuration and the characteristic of a part of the GO layer 14 is changed by the reduction treatment. This allows electrical separation between the source electrode 15A and the drain electrode 15B, while forming each of the r-GO layers 14a and 14b as the contact layer. Therefore, a residue such as the one described in C.-C. Kuo, T. N Jackson, [online], APPLIED PHYSICS LETTERS 94, 053304 (2009) does not attach onto the organic semiconductor layer 13, allowing avoidance of an increase in contact resistance resulting from this residue.

Furthermore, in the present embodiment, satisfactory contact is achieved between the source electrode 15A as well as the drain electrode 15B and the organic semiconductor layer 13. Thus, a material to be used for each of the source electrode 15A and the drain electrode 15B is selected more freely.

In the present embodiment, as described above, the GO layer 14 made of the graphene oxide is provided on the organic semiconductor layer 13, over the regions D1, D2, and D3, the regions D1 and D2 facing the source electrode 15A and the drain electrode 15B. The GO layer 14 has the r-GO layers 14a and 14b that exhibit the conductivity in the regions D1 and D2 and also exhibit the insulation in the region D3 between the regions D1 and D2, by the reduction of the part (the regions D1 and D2) thereof. This enables the r-GO layers 14a and 14b to each function as the contact layer, between the organic semiconductor layer 13 and the source electrode 15A as well as the drain electrode 15B. Also, the GO layer 14 is enabled to function as the etching stopper layer in the manufacturing process, in the case of adopting the top-contact structure. Therefore, satisfactory contact is allowed to be ensured between the source electrode 15A as well as the drain electrode 15B and the organic semiconductor layer 13. In addition, in the case of adopting the top-contact structure, damage to the organic semiconductor layer 13 in the manufacturing process is allowed to be reduced.

Next, organic TFTs according to modifications (modifications 1 to 4) of the embodiment will be described. In the following, the same elements as those of the embodiment will be provided with the same characters as those of the embodiment, and the description thereof will be omitted as appropriate.

Modification 1

Figure 6:
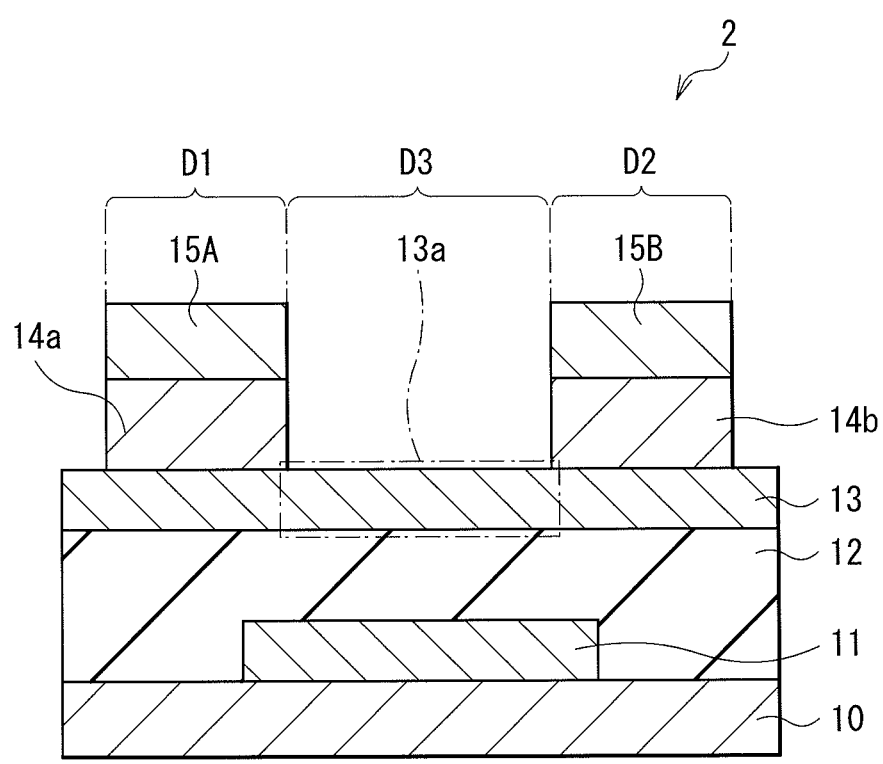
FIG. 6 is a cross-sectional diagram illustrating a schematic configuration of an organic TFT according to a modification 1.

In the organic TFT 1 of the embodiment described above, the GO layer 14 functioning as the etching stopper layer in the manufacturing process is allowed to remain as it is after the TFT is completed. However, of the GO layer 14, a part (including the region D3) except the regions D1 and D2 may be removed after the source and the drain are formed. An example of this case (an organic TFT 2) is illustrated in FIG. 6. As with the organic TFT 1 of the embodiment, the organic TFT 2 includes the gate electrode 11, the gate insulating film 12, and the organic semiconductor layer 13 on the substrate 10. The organic TFT 2 further includes the source electrode 15A and the drain electrode 15B in the regions D1 and D2 on the organic semiconductor layer 13, with the r-GO layers 14a and 14b interposed therebetween. In the present modification, however, a surface of the organic semiconductor layer 13 is exposed in the region D3 facing the channel 13a on the organic semiconductor layer 13. In other words, the oxide layer is formed of only the r-GO layers 14a and 14b each serving as the conductive layer, and the source electrode 15A and the drain electrode 15B are patterned into the same shapes as those of the r-GO layers 14a and 14b, respectively.

Figure 7A:
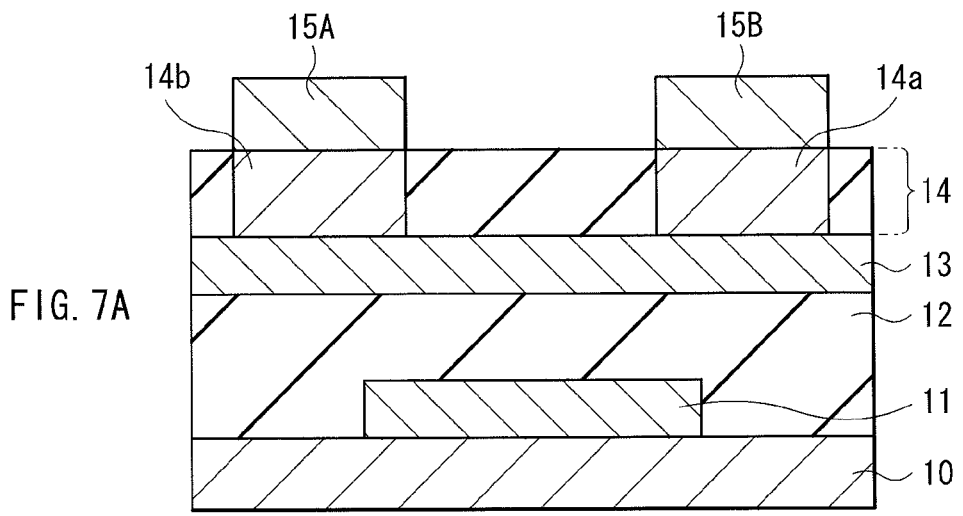
FIGS. 7A and 7B are cross-sectional diagrams used to describe a method of manufacturing the organic TFT illustrated in FIG. 6.
Figure 7B:
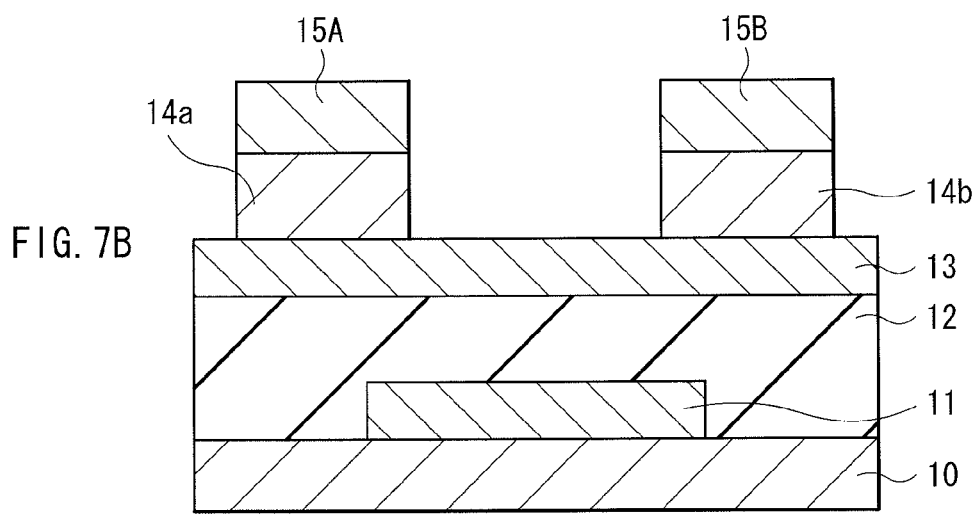

FIGS. 7A and 7B illustrate a process of removing the insulating layer from the GO layer 14, following the formation of the source electrode 15A and the drain electrode 15B. Specifically, at first, as illustrated in FIG. 7A, the source electrode 15A and the drain electrode 15B are formed on the GO layer 14 in a manner similar to the embodiment described above. Subsequently, as illustrated in FIG. 7B, only a part that has not been reduced (a layer part having solubility and insulation) is selectively removed from the GO layer 14, when being immersed in an alkaline water solution of about pH 10. The organic TFT 2 illustrated in FIG. 6 is thus formed.

Modification 2

Figure 8A:
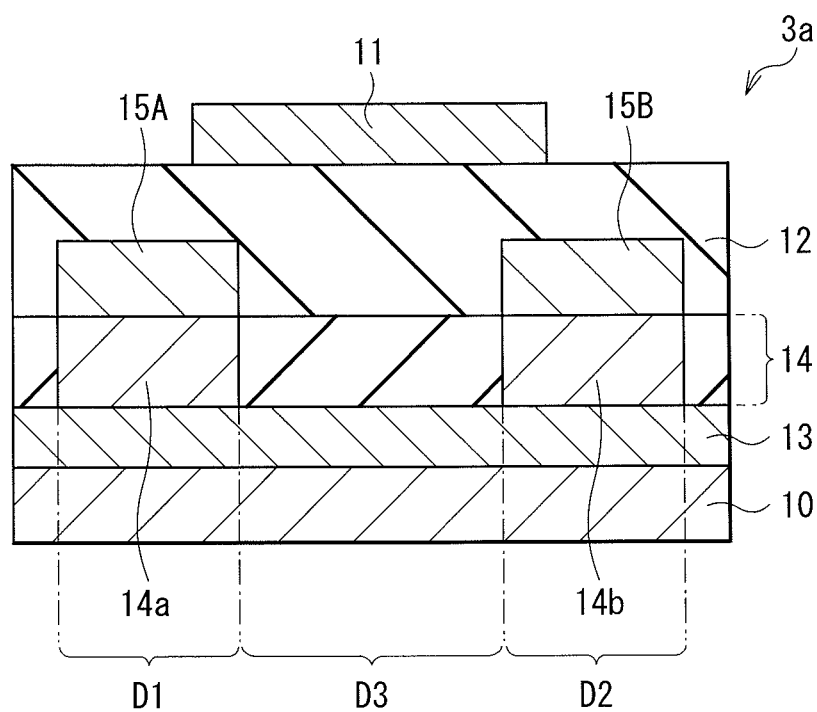
FIGS. 8A and 8B are cross-sectional diagrams each illustrating a schematic configuration of an organic TFT (top-gate/top-contact) according to a modification 2.

FIG. 8A illustrates a schematic configuration of an organic TFT (an organic TFT 3a) according to the modification 2. The organic TFT 3a is a field-effect transistor using an organic semiconductor, and has a top-contact structure, like the organic TFT 1 of the embodiment. However, this organic TFT 3a has a so-called top-gate structure in which the gate electrode 11 is provided above the organic semiconductor layer 13, unlike the embodiment.

Specifically, in the organic TFT 3a, the organic semiconductor layer 13 is formed on the substrate 10, and the GO layer 14 is provided on this organic semiconductor layer 13, in a manner similar to the organic TFT 1 of the embodiment. Further, the source electrode 15A and the drain electrode 15B are provided on the regions D1 and D2 of the GO layer 14. The gate insulating film 12 is provided to cover the source electrode 15A and the drain electrode 15B, and the gate electrode 11 is disposed on this gate insulating film 12.

Figure 8B:
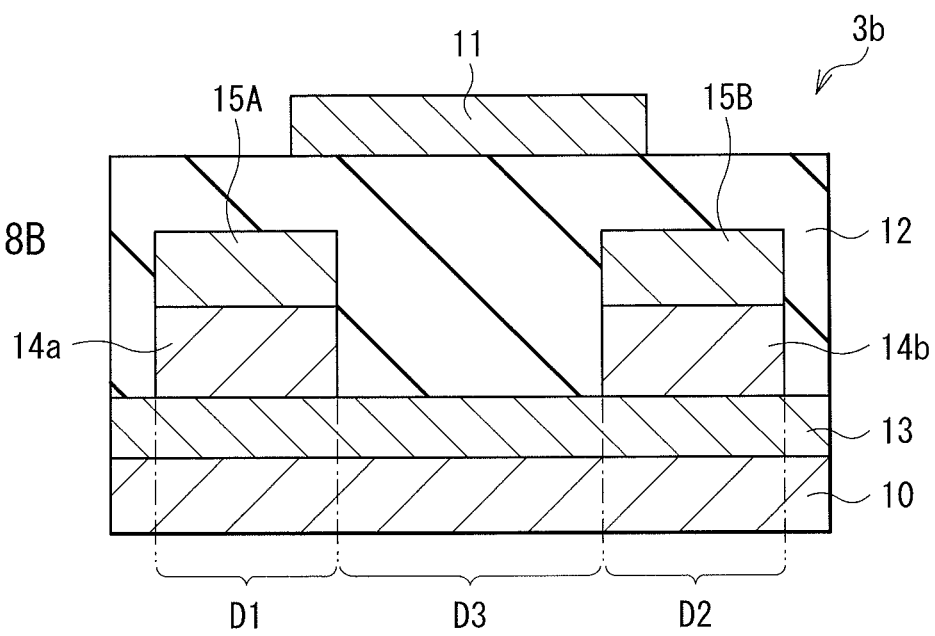

In this top-gate structure, a part except the r-GO layers 14a and 14b of the GO layer 14 may be selectively removed, in a manner similar to the modification 1. In this case, there is realized a structure in which the gate insulating film 12 covers the surface of the organic semiconductor layer 13 in the region D3, as represented by an organic TFT 3b illustrated in FIG. 8B, for example.

In the organic TFTs 3a and 3b of the top gate/top-contact structure, the source electrode 15A and the drain electrode 15B are provided on the organic semiconductor layer 13, with the GO layer 14 interposed therebetween. Thus, the GO layer 14 is allowed to function as the etching stopper layer, and the r-GO layers 14a and 14b are each allowed to function as the contact layer, in these TFTs as well. Therefore, the same effects as those of the embodiment are allowed to be obtained.

Modification 3

Figure 9:
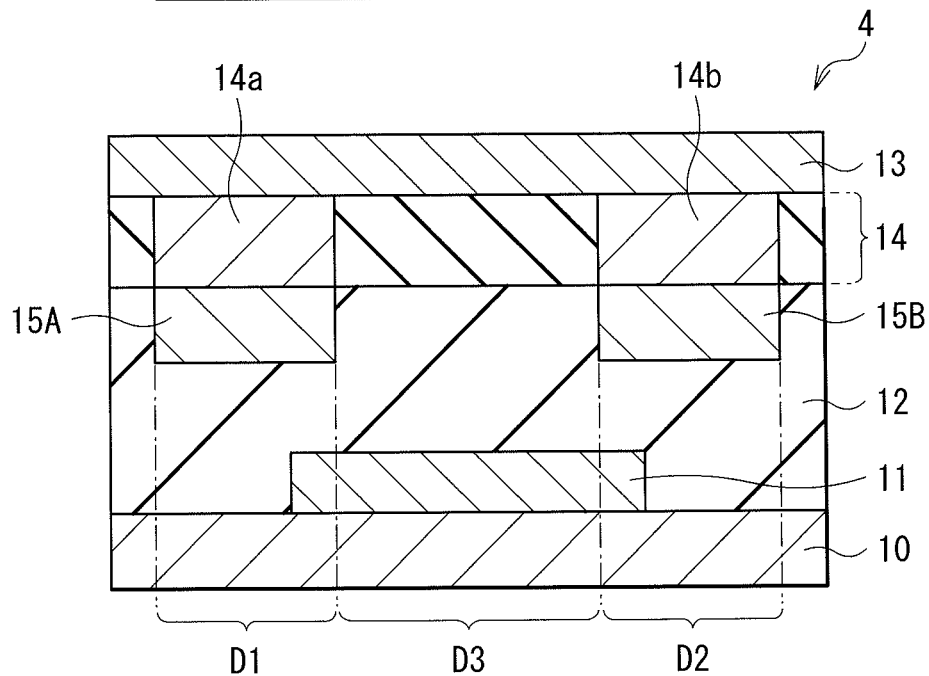
FIG. 9 is a cross-sectional diagram illustrating a schematic configuration of an organic TFT (bottom-gate/bottom-contact) according to a modification 3.

FIG. 9 illustrates a schematic configuration of an organic TFT (an organic TFT 4) according to the modification 3. The organic TFT 4 is a field-effect transistor using an organic semiconductor like the organic TFT 1 of the embodiment, but has a bottom-gate/bottom-contact structure.

Specifically, in the organic TFT 4, the gate insulating film 12 is provided to cover the gate electrode 11 on the substrate 10, and the GO layer 14 is formed on this gate insulating film 12. The source electrode 15A and the drain electrode 15B are provided on the regions D1 and D2 of the GO layer 14, respectively. The organic semiconductor layer 13 is formed to cover the GO layer 14, the source electrode 15A, and the drain electrode 15B.

In this organic TFT 4 of the bottom-gate/bottom-contact structure described above, the GO layer 14 is provided between the organic semiconductor layer 13 and the source electrode 15A as well as the drain electrode 15B. Thus, the r-GO layers 14a and 14b are each allowed to function as the contact layer, in this TFT as well. Therefore, satisfactory contact is allowed to be ensured between the source electrode 15A as well as the drain electrode 15B and the organic semiconductor layer 13.

Modification 4

Figure 10:
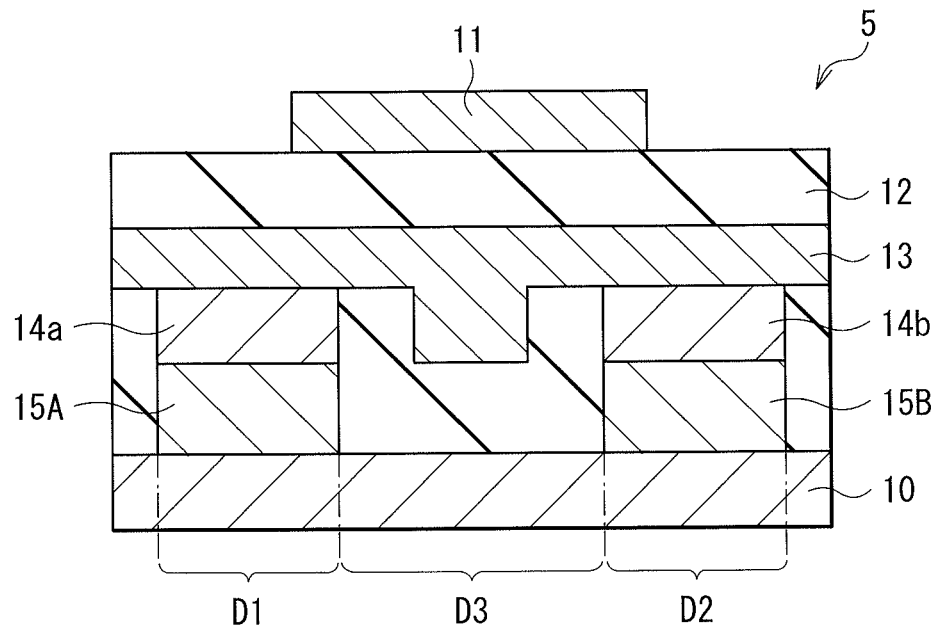
FIG. 10 is a cross-sectional diagram illustrating a schematic configuration of an organic TFT (top-gate/bottom-contact) according to a modification 4.

FIG. 10 illustrates a schematic configuration of an organic TFT (an organic TFT 5) according to the modification 4. The organic TFT 5 is a field-effect transistor using an organic semiconductor, like the organic TFT 1 of the embodiment, but has a top-gate/bottom-contact structure.

Specifically, in the organic TFT 5, the source electrode 15A and the drain electrode 15B are provided on the substrate 10, at regions corresponding to the regions D1 and D2. The GO layer 14 is formed to cover the source electrode 15A and the drain electrode 15B. The organic semiconductor layer 13 is provided on the GO layer 14, and the gate electrode 11 is disposed on this organic semiconductor layer 13, with the gate insulating film 12 interposed therebetween.

In the organic TFT 5 of the top-gate/bottom-contact structure described above, the GO layer 14 is provided between the organic semiconductor layer 13 and the source electrode 15A as well as the drain electrode 15B. Thus, the r-GO layers 14a and 14b are each allowed to function as the contact layer, in this TFT as well. Therefore, satisfactory contact is allowed to be ensured between the source electrode 15A as well as the drain electrode 15B and the organic semiconductor layer 13.

APPLICATION EXAMPLES

Figure 11:
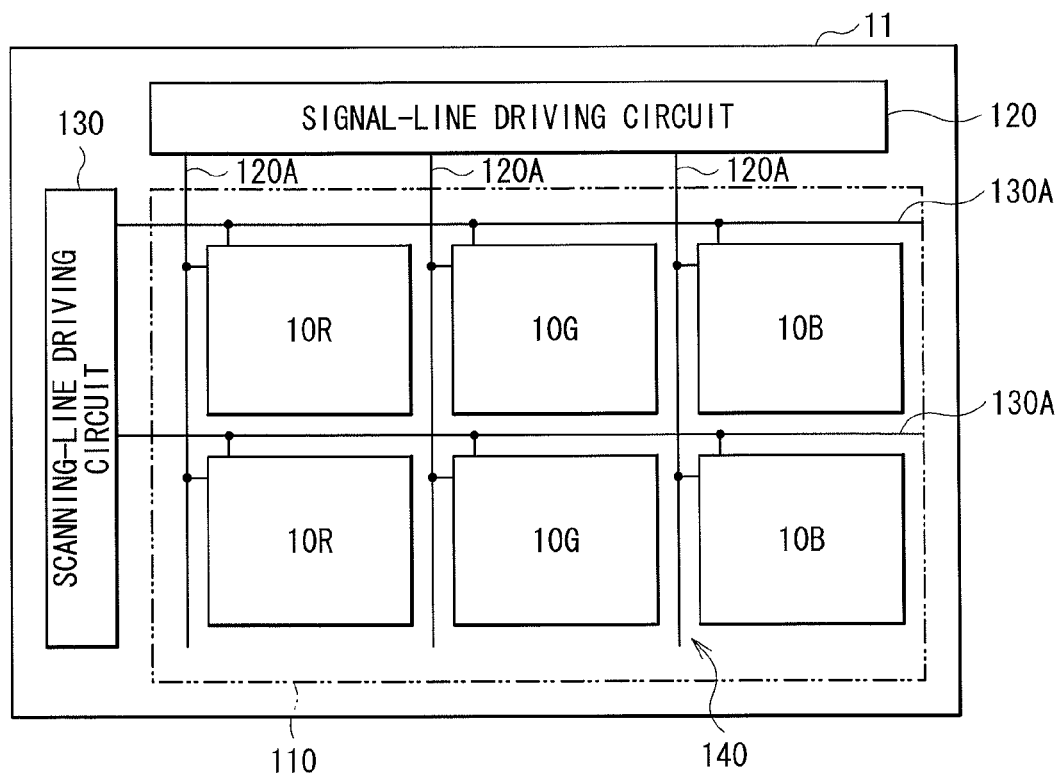
FIG. 11 is a schematic diagram illustrating a drive circuit configuration of a display according to an application example of the organic TFT in each of the embodiment and the modifications.

The organic TFTs 1 to 5 (the description will be provided below by taking the organic TFT 1 as an example) in the embodiment and the modifications are each used as a drive device in a display, for example. A liquid crystal display, an organic electroluminescence display, an electronic paper display, or the like may be used as the display. FIG. 11 illustrates a functional configuration of the display by way of example. In the display, a display region 110 and a pixel driving circuit 140 are provided on the substrate 11. The display region 110 includes a plurality of pixels PXL, and the pixel driving circuit 140 performs display driving of this display region 110. Provided around the display region 110 are a signal-line driving circuit 120 and a scanning-line driving circuit 130 that are drivers for image display.

The pixel driving circuit 140 is a drive circuit driven by, for example, an active matrix system. In this pixel driving circuit 140, a plurality of signal lines 120A are arranged in a column direction, and a plurality of scanning lines 130A are arranged in a row direction. An intersection of each of the signal lines 120A and each of the scanning lines 130A corresponds to each of the pixels PXL. Each of the signal lines 120A is connected to the signal-line driving circuit 120, and an image signal is supplied from the signal-line driving circuit 120 to each of the pixels PXL through the signal line 120A. Each of the scanning lines 130A is connected to the scanning-line driving circuit 130, and a scanning signal is sequentially supplied from the scanning-line driving circuit 130 to each of the pixels PXL through the scanning line 130A.

Further, the display including the organic TFT 1 may be mounted on an electronic unit according to each of application examples 1 to 6 which will be described below. Specifically, the display is applicable to electronic units in various fields, such as television receivers, digital cameras, laptop computers, portable terminals such as portable telephones as well as smartphones, video cameras, and the like. In other words, the display may be applicable to electronic units in various fields, which display externally-inputted image signals or internally-generated image signals as still or moving images.

Application Example 1

Figure 12:
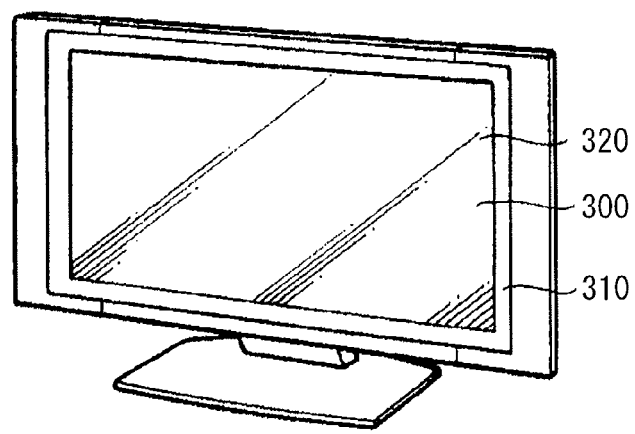
FIG. 12 is a perspective diagram illustrating an appearance of an application example 1 of a display according each of the embodiment and the modifications.

FIG. 12 illustrates an appearance of a television receiver according to the application example 1. This television receiver has, for example, an image-display screen section 300 that includes a front panel 310 and a filter glass 320. The image-display screen section 300 is equivalent to the above-described display.

Application Example 2

Figure 13A:
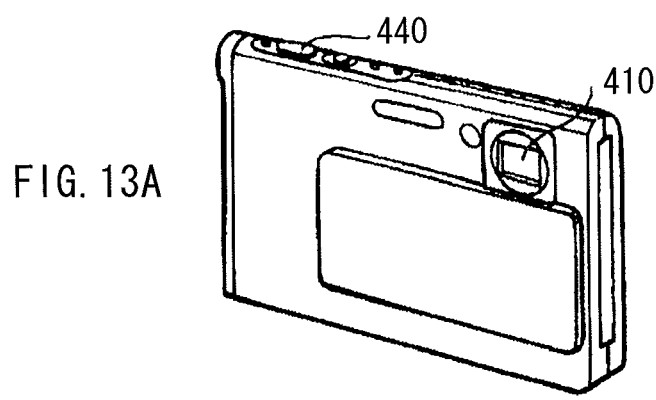
FIGS. 13A and 13B are perspective diagrams each illustrating an appearance of an application example 2, namely.
Figure 13B:
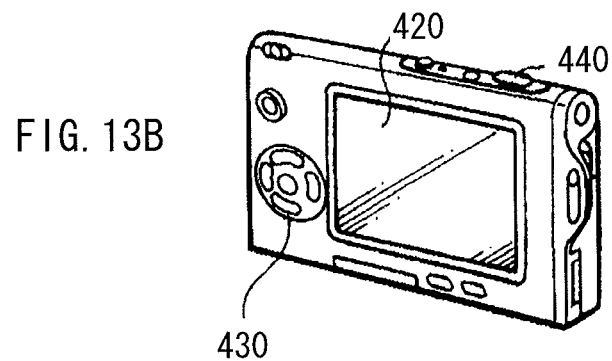

FIGS. 13A and 13B each illustrate an appearance of a digital camera according to the application example 2. This digital camera includes, for example, a flash emitting section 410, a display section 420, a menu switch 430, and a shutter release 440. The display section 420 serves as the above-described display.

Application Example 3

Figure 14:
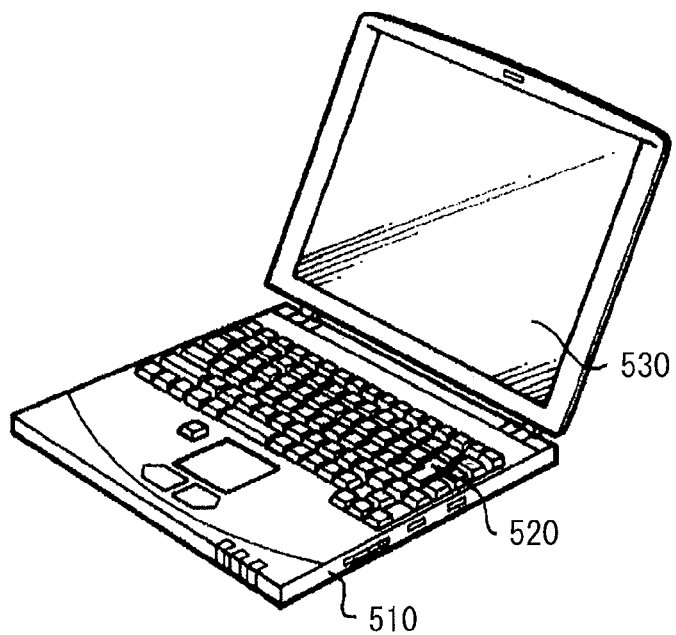
FIG. 14 is a perspective diagram illustrating an appearance of an application example 3.

FIG. 14 illustrates an appearance of a laptop computer according to the application example 3. This laptop computer includes, for example, a main body section 510, a keyboard 520 provided to enter characters and the like, and a display section 530 displaying an image. The display section 530 serves as the above-described display.

Application Example 4

Figure 15:
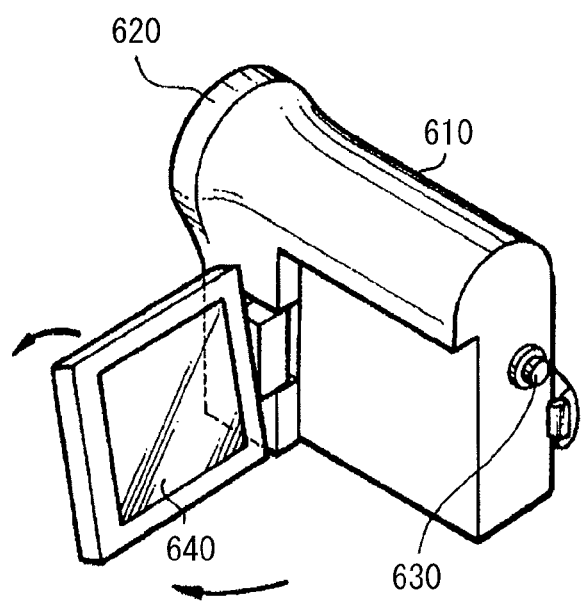
FIG. 15 is a perspective diagram illustrating an appearance of an application example 4.

FIG. 15 illustrates an appearance of a video camera according to the application example 4. This video camera includes, for example, a main body section 610, a lens 620 disposed on a front face of this main body section 610 to shoot an image of a subject, a start/stop switch 630 used in shooting, and a display section 640. The display section 640 serves as the above-described display.

Application Example 5

FIGS. 16A to 16G each illustrate an appearance of a portable telephone according to the application example 5. This portable telephone is, for example, a unit in which an upper housing 710 and a lower housing 720 are connected by a coupling section (a hinge section) 730, and includes a display 740, a sub-display 750, a picture light 760, and a camera 770. The display 740 or the sub-display 750 serves as the above-described display.

Application Example 6

Figure 17A:
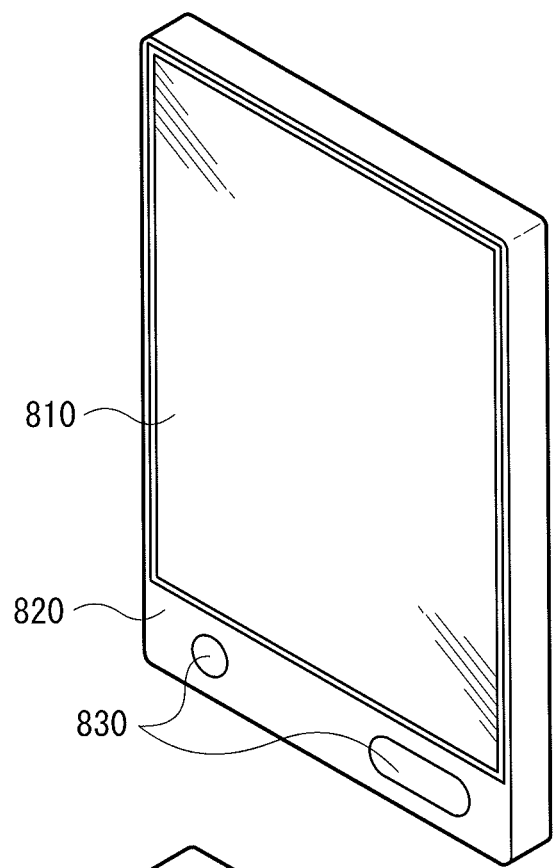
FIGS. 17A and 17B are perspective diagrams each illustrating an appearance of an application example 6.
Figure 17B:
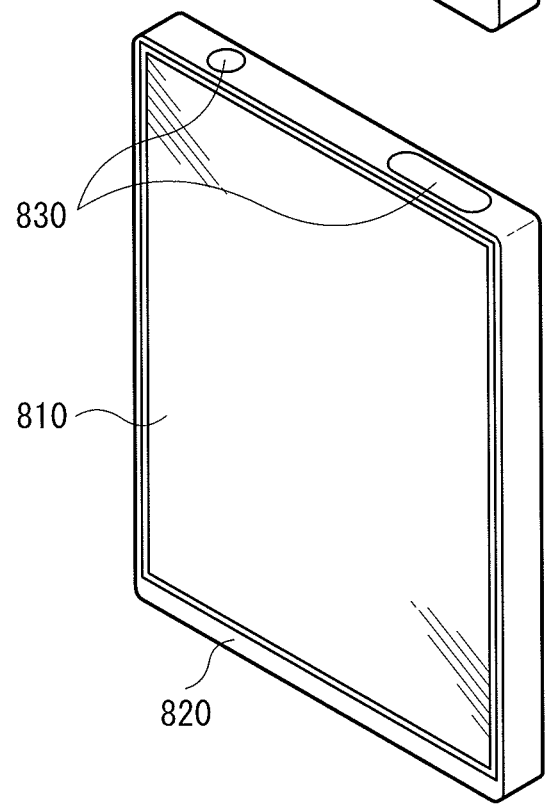

FIGS. 17A and 17B each illustrate an appearance of a smartphone according to the application example 6. This smartphone includes, for example, a display section 810, a non-display section 820, and an operation section 830. The operation section 830 may be formed either on the same surface as a surface (a front surface) of the display section 810 as illustrated in FIG. 17A, or on a surface (a top surface) different from the surface of the display section 810 as illustrated in FIG. 17B.

The embodiment, the modifications, and the application examples have been described above, but the contents of the disclosure are not limited thereto and may be variously modified. For example, in the embodiment and the modifications, the widths of the r-GO layers 14a and 14b formed in a part of the GO layer 14 are illustrated as being the same as those of the source electrode 15A and the drain electrode 15B in the figures, but may not be the same. Alternatively, for example, the respective widths of the r-GO layers 14a and 14b may be smaller or greater than the respective widths of the source electrode 15A and the drain electrode 15B.

Further, in the embodiment and the modifications, the layer containing the graphene oxide has been taken as an example of the oxide layer according to an embodiment of the disclosure, but may contain other kind of oxide, without being limited to this example. For example, a silver oxide layer containing a silver oxide may be provided between the semiconductor layer and the source electrode as well as the drain electrode. The silver oxide ($Al_2O_3$) is an oxide that exhibits insulation, but exhibits conductivity by going through reduction. Therefore, formation is similar to that in the above-described embodiments and the modification each using the graphene oxide, and similar effects are allowed to be obtained.

It is to be noted that the disclosure may be configured as follows:

(1) An organic thin-film transistor including:

a semiconductor layer made of an organic material;

a gate electrode;

a source electrode and a drain electrode each at least partially provided above the semiconductor layer; and a conductive layer containing an oxide having conductivity that changes due to reduction, the conductive layer being provided in each of a first region and a second region facing the source electrode and the drain electrode provided above the semiconductor layer, respectively.

(2) The organic thin-film transistor according to (1), wherein an oxide layer containing the oxide is provided over the first region, the second region, and a third region between the first region and the second region, on the semiconductor layer, the conductive layer is configured by reducing a selective part of the oxide layer, the selective part corresponding to each of the first region and the second region, and insulation is exhibited in the third region of the oxide layer.

(3) The organic thin-film transistor according to (1) or (2), wherein the oxide is a graphene oxide.

(4) The organic thin-film transistor according to (1) to (3), wherein the source electrode and the drain electrode are each patterned into a same shape as that of the conductive layer.

(5) The organic thin-film transistor according to any one of (1) to (4), wherein the gate electrode is provided in a selective region on a substrate, and the semiconductor layer is provided on the gate electrode, with a gate insulating film interposed therebetween.

(6) An organic thin-film transistor including:

a semiconductor layer made of an organic material;

a gate electrode, a source electrode, and a drain electrode; and an oxide layer provided between the source electrode as well as the drain electrode and the semiconductor layer, the oxide layer exhibiting conductivity in a first region and a second region facing the source electrode and the drain electrode, respectively, and the oxide layer exhibiting insulation in a third region between the first region and the second region.

(7) The organic thin-film transistor according to (6), wherein the oxide layer contains an oxide having conductivity that changes due to reduction.

(8) The organic thin-film transistor according to (7), wherein the oxide layer is configured by reducing a selective part thereof corresponding to each of the first region and the second region.

(9) The organic thin-film transistor according to (7) or (8), wherein the oxide is a graphene oxide.

(10) The organic thin-film transistor according to any one of (6) to (9), wherein the source electrode and the drain electrode are provided on the semiconductor layer with the oxide layer interposed therebetween.

(11) A method of manufacturing an organic thin-film transistor, the method including:

forming a semiconductor layer made of an organic material;

forming a gate electrode;

forming a source electrode and a drain electrode; and forming an oxide layer, the oxide layer exhibiting conductivity in a first region and a second region where the source electrode and the drain electrode are to be formed, respectively, the oxide layer exhibiting insulation in a third region between the first region and the second region.

(12) The method according to (11), wherein an oxide having conductivity that changes due to reduction is used in forming the oxide layer.

(13) The method according to (12), wherein in forming the oxide layer, an oxide film made of the oxide is formed over the first region to the third region, and the oxide film is then subjected to a reduction treatment in the first region and the second region.

(14) The method according to (13), wherein, of the oxide layer, a part corresponding to each of the first region and the second region is selectively exposed in the reduction treatment.

(15) The method according to any one of (11) to (14), further including:
selectively removing a part of the oxide layer after the oxide layer is formed, the part corresponding to the third region.

(16) The method according to (15), wherein the part of the oxide layer is removed using water or a water solution, the part corresponding to the third region.

(17) The method according to any one of (12) to (16), wherein a graphene oxide is used as the oxide.

(18) The method according to any one of (11) to (17), wherein forming the oxide layer is performed after forming the semiconductor layer and before forming the source electrode and the drain electrode.

(19) A display including a display section and an organic thin-film transistor, the display section including a plurality of pixels, the organic thin-film transistor serving as a drive device for each of the pixels, the organic thin-film transistor including:
a semiconductor layer made of an organic material;
a gate electrode;
a source electrode and a drain electrode provided above the semiconductor layer; and
a conductive layer containing an oxide having conductivity that changes due to reduction, the conductive layer being provided in each of a first region and a second region facing the source electrode and the drain electrode, respectively, and the source electrode and the drain electrode each being at least partially provided above the semiconductor layer.

(20) A display including a display section and an organic thin-film transistor, the display section including a plurality of pixels, the organic thin-film transistor serving as a drive device for each of the pixels, the organic thin-film transistor including:
a semiconductor layer made of an organic material;
a gate electrode, a source electrode, and a drain electrode; and
an oxide layer provided between the source electrode as well as the drain electrode and the semiconductor layer, the oxide layer exhibiting conductivity in a first region and a second region facing the source electrode and the drain electrode, respectively, and the oxide layer exhibiting insulation in a third region between the first region and the second region.

It should be understood by those skilled in the art that various modifications, combinations, sub-combinations and alterations may occur depending on design requirements and other factors insofar as they are within the scope of the appended claims or the equivalents thereof.

The application is claimed as follows:

1. An organic thin-film transistor comprising:
a semiconductor layer made of an organic material;
a gate electrode, a source electrode, and a drain electrode; and
an oxide layer provided between the source electrode as well as the drain electrode and the semiconductor layer, the oxide layer exhibiting conductivity in a first region and a second region facing the source electrode and the drain electrode, respectively, and the oxide layer exhibiting insulation in a third region between the first region and the second region.

2. The organic thin-film transistor according to claim 1, wherein the oxide layer contains an oxide having conductivity that changes due to reduction.

3. The organic thin-film transistor according to claim 2, wherein the oxide layer is configured by reducing a selective part thereof corresponding to each of the first region and the second region.

4. The organic thin-film transistor according to claim 2, wherein the oxide is a graphene oxide.

5. The organic thin-film transistor according to claim 1, wherein the source electrode and the drain electrode are provided on the semiconductor layer with the oxide layer interposed therebetween.

6. A method of manufacturing an organic thin-film transistor, the method comprising:
forming a semiconductor layer made of an organic material;
forming a gate electrode;
forming a source electrode and a drain electrode; and
forming an oxide layer, the oxide layer exhibiting conductivity in a first region and a second region where the source electrode and the drain electrode are to be formed, respectively, the oxide layer exhibiting insulation in a third region between the first region and the second region.

7. The method according to claim 6, wherein an oxide having conductivity that changes due to reduction is used in forming the oxide layer.

8. The method according to claim 7, wherein in forming the oxide layer, an oxide film made of the oxide is formed over the first region to the third region, and the oxide film is then subjected to a reduction treatment in the first region and the second region.

9. The method according to claim 8, wherein, of the oxide layer, a part corresponding to each of the first region and the second region is selectively exposed in the reduction treatment.

10. The method according to claim 6, further comprising:
selectively removing a part of the oxide layer after the oxide layer is formed, the part corresponding to the third region.

11. The method according to claim 10, wherein the part of the oxide layer is removed using water or a water solution, the part corresponding to the third region.

12. The method according to claim 7, wherein a graphene oxide is used as the oxide.

13. The method according to claim 6, wherein forming the oxide layer is performed after forming the semiconductor layer and before forming the source electrode and the drain electrode.

14. A display including a display section and an organic thin-film transistor, the display section including a plurality of pixels, the organic thin-film transistor serving as a drive device for each of the pixels, the organic thin-film transistor comprising:
a semiconductor layer made of an organic material;
a gate electrode, a source electrode, and a drain electrode; and
an oxide layer provided between the source electrode as well as the drain electrode and the semiconductor layer, the oxide layer exhibiting conductivity in a first region and a second region facing the source electrode and the drain electrode, respectively, and the oxide layer exhibiting insulation in a third region between the first region and the second region.

* * * * *